United States Patent
Bortolini et al.

[11] Patent Number: 5,912,559
[45] Date of Patent: Jun. 15, 1999

[54] APPARATUS FOR DETECTION AND LOCALIZATION OF ELECTROSTATIC DISCHARGE (ESD) SUSCEPTIBLE AREAS OF ELECTRONIC SYSTEMS

[75] Inventors: James R. Bortolini, Broomfield; William K. Honea, Denver; Charles J. Sherman, Westminster, all of Colo.

[73] Assignee: Lucent Technologies Inc., Murray Hill, N.J.

[21] Appl. No.: 08/655,715

[22] Filed: May 30, 1996

[51] Int. Cl.[6] .............................. G01N 27/61; G01R 31/10
[52] U.S. Cl. .......................... 324/456; 324/452; 324/512; 324/555
[58] Field of Search ...................................... 324/452, 456, 324/500, 512, 537, 555, 620, 626, 627

[56] References Cited

U.S. PATENT DOCUMENTS

| | | | |
|---|---|---|---|
| 5,166,624 | 11/1992 | Abernathy | 324/452 |
| 5,410,254 | 4/1995 | Consiglio | 324/456 |
| 5,430,604 | 7/1995 | Wong | 324/452 X |

*Primary Examiner*—Glenn W. Brown
*Attorney, Agent, or Firm*—John C. Moran

[57] ABSTRACT

An apparatus and method are disclosed for use in detecting and localizing electrostatically susceptible areas of electronic systems. An exemplary apparatus includes: (1) an ESD gun for providing a source of electric current; (2) a wire coil for generating a magnetic field; and (3) a shielded transmission line, such as a coaxial transmission line ("coax"), for receiving current from the gun. The center conductor of the coax is coupled at one end to the gun and at the other end to one end of the wire coil. The other end of the wire coil is coupled to ground. The current flowing through the wire coil creates a magnetic field, which is bi-directional and orthogonal to the plane of the coil. The magnetic field causes errors in the operation of the system under test when the coil is placed in close proximity with ESD susceptible system components. As such, components that are ESD susceptible can be easily detected and localized. Another feature of the foregoing exemplary apparatus includes a magnetic field absorptive shield (e.g. ferrite-based) coupled to the coax and situated substantially parallel to the plane of the coil. The shield is used to effectively inhibit the magnetic field from emanating from one side of said coil, thereby providing further directionality to the apparatus.

26 Claims, 1 Drawing Sheet

APPARATUS FOR DETECTION AND LOCALIZATION OF ELECTROSTATIC DISCHARGE (ESD) SUSCEPTIBLE AREAS OF ELECTRONIC SYSTEMS

TECHNICAL FIELD

This invention relates generally to an apparatus and method for use in the detection of electrostatically sensitive areas of electronic systems and, more particularly, to a portable apparatus that can be used to localize areas of components, circuit boards, subracks or systems that are most sensitive to electrostatic discharge events.

BACKGROUND

The term "electrostatic discharge" refers to the transfer of electric charge between bodies of different electrostatic potential in proximity or through direct contact. The International Electrotechnical Commission (IEC), Bellcore and others have promulgated standards, which relate to the immunity requirements and test methods for electrical and electronic equipment subjected to electrostatic discharges from operators directly and, from adjacent objects. See "Electrostatic Immunity Discharge Test", International Standard IEC 1000-4-2(1st Ed. 1995); IEC 801-2 (2nd Ed. 1991). The object of these standards is to establish a common and reproducible basis for evaluating the performance of electrical and electronic equipment when subjected to electrostatic discharges.

The principal tool for testing a system's compliance with the foregoing standards is an electrostatic discharge ("ESC") generator or, what is known in the art as, an "ESD Gun." An ESD gun generates high voltages/currents and, is used to discharge electrostatic energy directly into the system being tested. The gun is built in accordance with IEC specifications and accordingly, the gun's discharge model contains the timing characteristics (e.g. the waveshape of the discharge current) specified by the IEC. The ability of a system under test to perform without degradation, whether temporary or permanent, in the presence of the ESD disturbance is used in assessing the system's ESD susceptibility. A degradation in performance can range from a transient malfunction of the system to the damage of components therein.

System tests for ESD susceptibility are performed using measurable performance criteria. Such criteria includes testing under a particular system configuration (e.g. the system at a particular stage in development is one system configuration and, the system as delivered to the customer is another; each would have its own ESD susceptibility characteristics), climatic condition (e.g. low relative humidity), and level of ESD intensity. Moreover, testing is designed to match a variety of electrical conductivities including that of an operator and that of adjacent objects. In this regard, both contact tests and air tests are used, although contact tests are typically favored. During a contact test, the gun is held in contact with the system under test. During an air test, an arc gap is introduced between the gun and the system.

Although the ESD gun is very useful in approximating the real ESD phenomena at the macroscopic level (i.e. determining whether the system as a whole is compliant with IEC standards), the gun does not provide much in the way of fault isolation. This is primarily because the gun's discharge affects a large section of the system simultaneously. As such, lab personnel assigned the task of pinpointing system weaknesses currently have no convenient way of doing so. Their task involves determining whether a system's failure was the result of a single ESD susceptible component or a plurality of such components. When multiple sources of ESD susceptibility exist, each must be identified and ESD hardened before there can be any macroscopic improvement in performance. As one would expect, the larger the system being tested, the more difficult it becomes to isolate each of the ESD susceptible components therein.

Moreover, the use of additional test equipment, such as an oscilloscope, to localize ESD susceptible components is typically not feasible because the scope's probes, when introduced into the system, alter the ESD susceptibility of the components therein. As expected, this can easily lead to an erroneous success (or failure) indication during fault isolation attempts.

Once localized, ESD susceptibility can usually be modified and retested successfully. Accordingly, there is a need for an apparatus that is effective in finding ESD susceptible "hotspots" in systems that have failed conventional ESD testing. These "hotspots" can be major contributors to overall ESD susceptibility problems in the system. Such an apparatus, while facilitating the detection of ESD susceptible components, would decrease engineering man-hours and time to market for ESD immune products.

SUMMARY OF INVENTION

The above-identified problems are solved and a technical advance is achieved in the art by providing an apparatus and method for use in detecting and localizing electrostatically susceptible areas of electronic systems. An exemplary apparatus for use with a source of electrostatic discharge (ESD) energy in detecting and localizing such areas includes a magnetic field generator having a first end and a second end, wherein the first end is coupled to the source of ESD energy and the second end is coupled to ground. Electric current from the source of ESD energy flows through the magnetic field generator causing a magnetic field to emanate therefrom. The magnetic field subsequently induces errors in the operation of the system under test when the magnetic field generator is placed in close proximity with one of the ESD susceptible system components. As such, the foregoing apparatus greatly facilitates the detection and localization of such components.

Other and further aspects of the present invention will become apparent during the course of the following description and by reference to the attached drawings.

DETAILED DESCRIPTION

Figure 1:
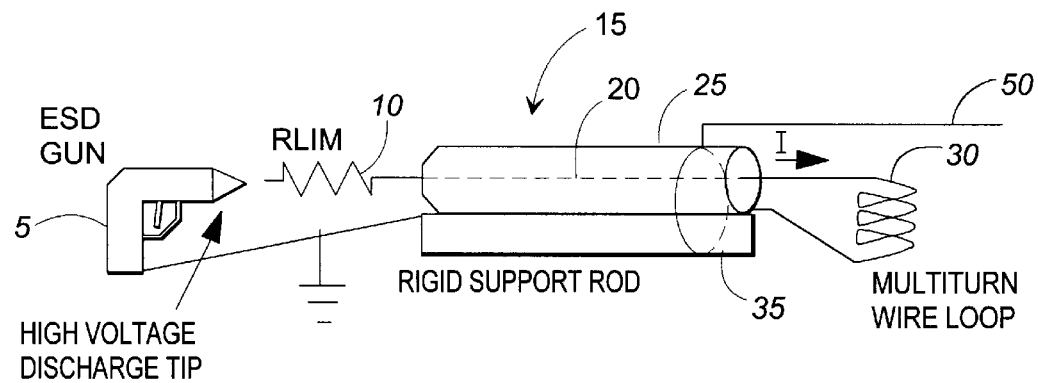
FIG. 1 depicts one embodiment of the present invention.

Referring now to the drawings wherein like reference numbers refer to like parts, FIG. 1 is a diagram of one embodiment of the present invention. As shown in FIG. 1, this embodiment comprises an ESD gun 5 (an exemplary source of ESD energy), a limiting resistor 10, a transmission line 15, a rigid non-conductive support rod 35 and a loop of multi-turn wire 30 (an exemplary magnetic field generator).

The ESD gun 5, which, as discussed above, is a standard device for testing ESD susceptibility, is used in the embodiment of FIG. 1 as a source of ESD disturbance. The ESD energy emanates from the gun's high voltage discharge tip. For contact discharge tests, the high voltage tip of the gun 5 is kept in contact with the limiting resistor 10. For air discharge tests, an arc gap is used between the tip of the gun 5 and the limiting resistor 10. The gap is used to simulate the rise times associated with air discharge tests.

An ESD "event" begins by triggering the gun 5. Once the gun 5 has been triggered, current flows from the tip of the gun, through the limiting resistor 10, and into the center conductor 20 of the transmission line 15. The transmission line is preferably a linear phase/low loss transmission line, such as a coaxial, twin-axial, or shielded pair line. At the far end of the transmission line 15, a magnetic field generator, such as a loop of multi-turn wire 30 (hereinafter "the coil"), connects the center conductor 20 with the shield 25 of the transmission line 15. Current flowing in the center conductor 20 passes through the coil 30 and returns to the ground of the gun 5. A non-conductive rod 35 is used to support the transmission line 15 and thus permit extension of the coil 30 in a controlled fashion to the area being tested. With an occurrence of an ESD event (i.e. triggering of the gun 5), the transmission line 15 and, more particularly, the attached coil 30 is held at a fixed distance from a small area of the system to be tested. The current in the coil 30 possesses all of the IEC specified timing characteristics by virtue of the coil's connection to the ESD gun 5 and thus, the localized magnetic field disturbance of the coil 30 is substantially equivalent to the macroscopic event of the gun 5 alone. The primary distinction being, however, that the associated current levels in the coil 30 are greatly attenuated. The intense magnetic fields (discussed more fully below) associated with the ESD currents in the coil 30, will couple into a small area of the system being tested and, will effectively act as a "spotlight" of locally intense ESD phenomena. As the "spotlight" is cast over the ESD sensitive components in the system, a degradation in the system's performance will be experienced. Due to the attenuated nature of the current levels in the coil 30, a degradation in system performance never reaches the level of damage to system components or software.

The term "component" as used herein, may be any subunit of a larger unit or system. Thus, a component may be, for example, a circuit board in a subrack assembly. Testing of the subrack assembly using the apparatus of the present invention may be performed, for example, by monitoring the subrack assembly's output (e.g. digital communications data) while passing the coil 30 of the present invention over each circuit board; any anomalies or errors in the output data would be attributed to the ESD susceptibility of the circuit board closest to the foregoing coil 30. With these definitions of a component and system in mind, it is readily apparent that the apparatus of the present invention can similarly be used to localize ESD susceptible chips on the circuit board or, alternatively, ESD susceptible subrack assemblies in a larger rack assembly.

Thus, in accordance with measurable performance criteria, such as a particular system configuration, climatic condition and ESD intensity, the apparatus of the present invention is used to plot a physical ESD susceptibility map of a system that has failed conventional ESD testing. The ESD susceptible components identified during mapping are modified (or, in other words, ESD hardened) and, thereafter, another susceptibility map is plotted for the system. If the re-mapping still results in some components being identified as ESD susceptible, those components must be modified and yet another susceptibility map of the system plotted. This process of "mapping and modifying" is repeated until no system components are identified as being ESD susceptible.

At that point, the system is re-tested using the ESD gun without the apparatus of the present invention (i.e. conventional ESD immunity testing in accordance with IEC standards). If the system fails such testing, the apparatus of the present invention is again used to plot an ESD susceptibility map for the system; however, this time, a slightly increased level of ESD intensity is used. The process of "mapping and modifying" as described in the preceding paragraph is performed until no ESD susceptible components are identified. At that point, the system is again re-tested using the ESD gun alone. If the system fails such testing, the entire process of "mapping and modifying" using the apparatus of the present invention followed by re-testing using the ESD gun alone is repeated until the system passes conventional ESD testing.

Figure 2:
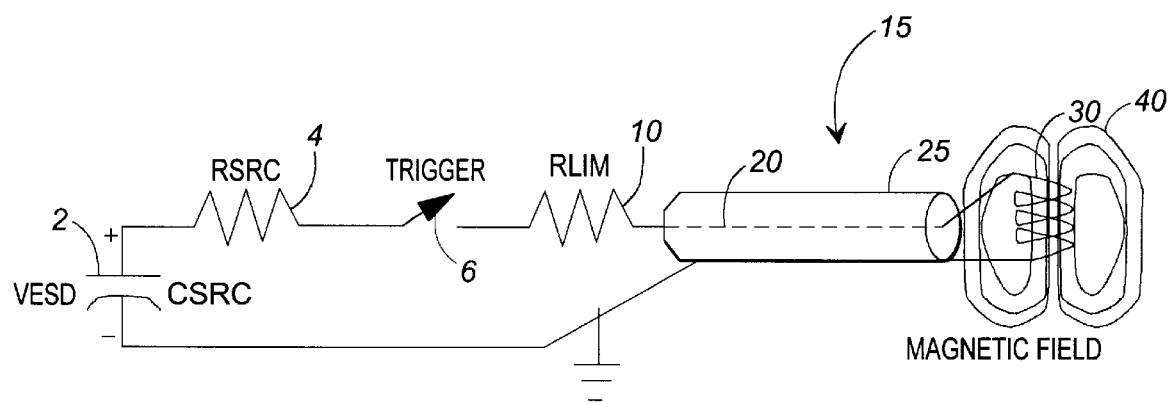
FIG. 2 provides an illustrative electric circuit/electromagnetic model for the embodiment of FIG. 1.

FIG. 2 illustrates an electric circuit/electromagnetic model of the embodiment shown in FIG. 1. As shown in FIG. 2, an equivalent source model to the ESD gun is a charged capacitor 2 with a series resistor 4. When the trigger switch 6 shown in FIG. 2 is closed, current flows through the limiting resistor 10 and the transmission line 15, finds an inductive/resistive load in the coil 30, and then flows to ground.

The current rise time is limited primarily by the impedance characteristics of the coil 30; if ideal, then only by the inductance of the coil 30 (the smaller the inductance, the greater the rise time slope). Peak current is determined by the series resistance (Rsrs 4+Rlim 10), and the decay of current from the peak current value to zero is determined by the resistance-capacitance combination (Rsrc 4+Rlim 10 and Csrc 2). With this in mind, the calculation of actual values for each of the elements in the embodiment shown in FIGS. 1 and 2 would be routine to those of ordinary skill in the art. Exemplary values for some of the elements therein include Csrc=150 pf, Rsrc=50 Ω, and Rlim=5000 Ω.

As shown in FIG. 2, the time-varying magnetic field 40 from the center of the coil 30 is highly directional (bi-directional and orthogonal to the plane of the coil 30) and proportional to the current in the coil 30. As discussed above, the magnetic field 40 emanating from the coil 30 creates a current flow in any conductive elements through which the field passes, and this disturbance can very nearly approximate a macroscopic ESD event in those elements.

At times, it may be desirable to generate a uni-directional ESD disturbance, such as in the case where the transmission line 15 and the attached coil 30 are inserted between two circuit boards mounted vertically in a subrack assembly; a bi-directional magnetic field would not permit an operator to test the ESD susceptibility of each of the boards individually. In such instances, a magnetic field absorptive shield 50 (e.g. a shield made of ferrite or any other material that attenuates magnetic fields) can be coupled to the transmission line 15 and placed on one side of the coil, substantially parallel to the plane of the coil 30, to contain the flux emanating therefrom and thereby permit lab personnel to determine the ESD susceptibility of each board individually. Those of ordinary skill in the art will recognize that the introduction of this type of shield, while adding further directionality to the device of the present invention, will also change the inductance of the coil 30 therein. A magnetic field conductive shield (e.g. a shield made of nickel alloy or any other material with a high magnetic permeability) may also be used to contain the flux emanating from one side of the coil. In particular, the magnetic field conductive shield can be coupled to the transmission line 15 and placed on one side of the coil 30, substantially parallel to the plane of the coil.

The many features and advantages of the present invention are apparent from the detailed specification, and thus, it is intended by the appended claims to cover all such features and advantages of the invention which fall within the true spirit and scope of the present invention.

Furthermore, since numerous modifications and variations will readily occur to those skilled in the art, it is not desired that the present invention be limited to the exact construction and operation illustrated and described herein, and accordingly, all suitable modifications and equivalents which may be resorted to are intended to fall within the scope of the claims.

We claim:

1. An apparatus for use with an ESD gun in localizing electrostatic discharge (ESD) susceptible components of a system, said ESD gun providing a source of electric current, comprising:

a wire coil;

a shielded transmission line for receiving said electric current from said ESD gun, said transmission line having a first end and a second end, said first end coupled to said gun via a limiting resistor and said second end coupled to said wire coil, wherein said electric current flows through said coil and creates a magnetic field that causes errors in the operation of said system when said coil is placed at a fixed distance from one of said ESD susceptible components, thereby localizing an ESD susceptible component of said system; and a shield to contain the magnetic field emanating from one portion of said wire coil.

2. The apparatus of claim 1 wherein said limiting resistor is in contact with a discharge tip of said gun.

3. The apparatus of claim 1 wherein said transmission line comprises a coaxial transmission line with a center conductor having a first end and a second end and wherein said first end of said center conductor is coupled to said limiting resistor and said second end of said center conductor is coupled to said coil.

4. The apparatus of claim 3 further comprising a nonconductive rigid rod coupled to said transmission line to provide support thereto.

5. The apparatus of claim 4 wherein said magnetic field is bi-directional and orthogonal to the plane of said coil.

6. The apparatus of claim 5 wherein said shield is a magnetic field absorptive shield coupled to said second end of said transmission line, said absorption shield situated substantially parallel to said plane of said coil so as to contain the magnetic field emanating from one side of said coil to thereby provide a unidirectional magnetic field.

7. The apparatus of claim 5 wherein said shield is a magnetic field conductive shield coupled to said second end of said transmission line, said conductive shield situated substantially parallel to said plane of said coil so as to contain the magnetic field emanating from one side of said coil to thereby provide a unidirectional magnetic field.

8. An apparatus for localizing electrostatic discharge (ESD) susceptible components of a system, comprising:

an ESD gun for providing a source of electric current;

a wire coil;

a shielded transmission line for receiving electric current from said gun, said transmission line having a first end and a second end, said first end coupled to said gun via a limiting resistor and said second end coupled to said wire coil, wherein said electric current flows through said coil and creates a magnetic field that causes errors in the operation of said system when said coil is placed at a fixed distance from one of said ESD susceptible components, said apparatus thereby localizing an ESD susceptible component of said system; and a shield to contain the magnetic field emanating from one portion of said wire coil.

9. The apparatus of claim 8 wherein said limiting resistor is in contact with a discharge tip of said gun.

10. The apparatus of claim 8 wherein said transmission line comprises a coaxial transmission line with a center conductor having a first end and a second end and wherein said first end of said center conductor is coupled to said limiting resistor and said second end of said center conductor is coupled to said coil.

11. The apparatus of claim 10 further comprising a nonconductive rigid rod coupled to said transmission line to provide support thereto.

12. The apparatus of claim 8 wherein said magnetic field is bi-directional and orthogonal to the plane of said coil.

13. The apparatus of claim 12 wherein said shield is a magnetic field absorptive shield coupled to said second end of said transmission line, said absorptive shield situated substantially parallel to said plane of said coil so as to contain the magnetic field emanating from one side of said coil to thereby provide a unidirectional magnetic field.

14. The apparatus of claim 12 wherein said shield is a magnetic field conductive shield coupled to said second end of said transmission line, said conductive shield situated substantially parallel to said plane of said coil so as to contain the magnetic field emanating from one side of said coil to thereby provide a unidirectional magnetic field.

15. An apparatus for use with means for generating an electrostatic discharge (ESD) pulse in localizing ESD susceptible components of a system, comprising:

means for generating a magnetic field;

means for receiving current from said means for generating an ESD pulse, said means for receiving current having a first end and a second end, said first end coupled to said means for generating an ESD pulse and said second end coupled to said means for generating a magnetic field, wherein said current flows through said means for generating a magnetic field and creates a magnetic field that causes errors in the operation of said system when said means for generating a magnetic field is placed in close proximity with one of said ESD susceptible components, thereby localizing ESD susceptible components of said system; and means for containing the magnetic field emanating from one portion of said means for generating a magnetic field.

16. An apparatus for localizing electrostatic discharge (ESD) susceptible components of a system, comprising:

means for generating an ESD pulse;

means for generating a magnetic field;

means for receiving current from said means for generating an ESD pulse, said means for receiving current having a first end and a second end, said first end coupled to said means for generating an ESD pulse and said second end coupled to said means for generating a magnetic field, wherein said current flows through said means for generating a magnetic field and creates a magnetic field that causes errors in the operation of said system when said means for generating a magnetic field is placed in close proximity with one of said ESD susceptible components, said apparatus thereby localizing ESD susceptible components of said system; and means for containing the magnetic field emanating from one portion of said means for generating a magnetic field.

17. An apparatus for use with a source of electrostatic discharge (ESD) energy in localizing ESD susceptible components of a system, comprising:

a magnetic field generator having a first end and a second end, said first end coupled to said source of ESD energy and said second end coupled to ground, wherein electric current from said source of ESD energy flows through said magnetic field generator and causes a magnetic field to emanate therefrom, said magnetic field inducing errors in the operation of said system when said magnetic field generator is placed in close proximity with one of said ESD susceptible components, thereby localizing said ESD susceptible components of said system; and a shield to contain the magnetic field emanating from one portion of said magnetic field generator.

18. The apparatus of claim 17, wherein the shield is situated substantially parallel to the plane of said magnetic field generator to contain the magnetic field emanating from one side of said magnetic field generator.

19. The apparatus of claim 17, wherein the shield is a magnetic field absorptive shield.

20. The apparatus of claim 19, wherein the shield is a ferrite shield.

21. The apparatus of claim 17, wherein the shield is a magnetic field conductive shield.

22. The apparatus of claim 21, wherein the shield is a nickel alloy shield.

23. An apparatus for localizing electrostatic discharge (ESD) susceptible components of a system, comprising:

a source of ESD energy;

a magnetic field generator having a first end and a second end, said first end coupled to said source of ESD energy and said second end coupled to ground, wherein electric current from said source of ESD energy flows through said magnetic field generator and causes a magnetic field to emanate therefrom, said magnetic field inducing errors in the operation of said system when said magnetic field generator is placed in close proximity with one of said ESD susceptible components, thereby localizing said ESD susceptible components of said system; and a shield to contain the magnetic field emanating from one portion of said magnetic field generator.

24. The apparatus of claim 23, wherein the shield is situated substantially parallel to the plane of said magnetic field generator to contain the magnetic field emanating from one side of said magnetic field generator.

25. The apparatus of claim 23, wherein the shield is a magnetic field absorptive shield.

26. The apparatus of claim 23, wherein the shield is a magnetic field conductive shield.

* * * * *